United States Patent
Kobayashi

(10) Patent No.: US 8,222,620 B2
(45) Date of Patent: Jul. 17, 2012

(54) LIGHT IRRADIATION APPARATUS AND LIGHT IRRADIATION METHOD

(75) Inventor: Kenji Kobayashi, Tokyo (JP)

(73) Assignee: Lintec Corporation, Tokyo (JP)

( * ) Notice: Subject to any disclaimer, the term of this patent is extended or adjusted under 35 U.S.C. 154(b) by 47 days.

(21) Appl. No.: 12/993,682

(22) PCT Filed: May 22, 2009

(86) PCT No.: PCT/JP2009/059412
§ 371 (c)(1),
(2), (4) Date: Nov. 19, 2010

(87) PCT Pub. No.: WO2009/150929
PCT Pub. Date: Dec. 17, 2009

(65) Prior Publication Data
US 2011/0089337 A1    Apr. 21, 2011

(30) Foreign Application Priority Data
Jun. 12, 2008  (JP) .................. 2008-154209

(51) Int. Cl.
*A61N 5/00* (2006.01)
(52) U.S. Cl. .................. 250/492.2; 250/492.1
(58) Field of Classification Search ............... 250/492.2, 250/492.1, 504 R
See application file for complete search history.

(56) References Cited

U.S. PATENT DOCUMENTS

| | | | |
|---|---|---|---|
| 5,390,044 A * | 2/1995 | Ito et al. ..................... | 359/212.1 |
| 6,342,702 B1 | 1/2002 | Jinbo et al. | |
| 7,577,070 B2 * | 8/2009 | Kawasaki et al. .......... | 369/53.19 |

FOREIGN PATENT DOCUMENTS

| | | |
|---|---|---|
| JP | 08257468 A | 10/1996 |
| JP | 2000218156 A | 8/2000 |
| JP | 2001290000 A | 10/2001 |
| JP | 2006142186 A | 6/2006 |
| JP | 2008060393 A | 3/2008 |

* cited by examiner

*Primary Examiner* — Kiet T Nguyen
(74) *Attorney, Agent, or Firm* — Lowe Hauptman Ham & Berner LLP

(57) ABSTRACT

A light irradiation apparatus 10 is configured to comprise: a supporting means 11 for supporting a semiconductor wafer W as an irradiated object, the semiconductor wafer W being stuck with an adhesive sheet S having an ultraviolet curable adhesive on a circuit formation surface; and a light irradiating means 13 having a focus axis P at a location spaced by a predetermined distance, and being provided so as to enable head-swinging motion thereof. The supporting means 11 is supported by a multi-joint robot 12, and relatively displaces the wafer W so as to prevent an adhesive layer surface SA of the adhesive sheet S from deviating from a position of the focus axis P, when the ultraviolet ray irradiating means 13 performs the head-swinging motion.

6 Claims, 6 Drawing Sheets

LIGHT IRRADIATION APPARATUS AND LIGHT IRRADIATION METHOD

RELATED APPLICATIONS

The present application is national phase of PCT/JP2009/059412 filed May 22, 2009, and claims priority from, Japanese Application Number 2008-154209, filed Jun. 12, 2008.

FIELD OF THE INVENTION

The present invention relates to a light irradiation apparatus and light irradiation method, and particularly, a light irradiation apparatus and light irradiation method that can uniformly perform light irradiation in a small space and without changing the amount of irradiation of light per unit area when irradiating a semiconductor wafer as an irradiated object with light, the semiconductor wafer being stuck with a photoreactive adhesive sheet.

BACKGROUND OF THE ART

Processing apparatuses for semiconductor wafers (hereinafter, simply referred to as "wafers") perform processing to conduct rear face grinding with a protective adhesive sheet stuck to a circuit surface of the wafers and to perform singulation into a plurality of chips while sticking a dicing tape. In adhesive sheets for use in such processing, ultraviolet curable (photoreactive) adhesives are adopted as adhesives. After the processing as described above, adhesives are cured by an ultraviolet ray irradiating apparatus to weaken the adhesion thereof so that peeling off is easily performed so as to prevent the wafers from being damaged.

Such an ultraviolet ray irradiating apparatus is disclosed in Patent document 1, as an example. In the ultraviolet ray irradiating apparatus in this document, such an arrangement is adopted that a lamp house is provided so as to enable head-swinging motion thereof with respect to a wafer stuck with an ultraviolet curable adhesive tape, and the head-swinging speed thereof is controlled responding to the irradiation angle of an ultraviolet ray so that a small space is realized and integrated light quantity of the ultraviolet ray is maintained constant in a whole region to be irradiated.

[Patent document 1] Japanese Patent Application Laid-Open No. 2001-290000

SUMMARY OF THE INVENTION

Problem to be Solved by the Invention

However, although the ultraviolet ray irradiating apparatus disclosed in Patent document 1 can realize the small space by causing the head-swinging motion of a light source, there is such a disadvantage that the ultraviolet ray irradiating apparatus requires controlling for reducing the head-swinging speed of the lamp house and increasing illuminance for an irradiated surface which is far away from the light source in order to maintain integrated light quantity in an region to be irradiated constant, and the control thereof is complicated.

Object of the Invention

The present invention has been proposed in view of the above disadvantages. It is an object of the present invention to provide a light irradiation apparatus and light irradiation method that can uniformize the amount of irradiation of light per unit area in an irradiated surface in a small space without requiring complicated control.

Means for Solving Problems

In order to achieve the above object, the present invention adopts such an arrangement that a light irradiation apparatus comprises: a supporting means for supporting an irradiated object; and a light irradiating means having a focus at a location spaced by a predetermined distance and being provided so as to enable head-swinging motion thereof; wherein the supporting means relatively displaceably supports the irradiated object with respect to the light irradiating means so as to prevent an irradiated surface of the irradiated object from deviating from a position of the focus, correspondingly to the head-swinging motion of the light irradiating means.

Also, the present invention adopts such an arrangement that a light irradiation apparatus comprises: a supporting means for supporting a semiconductor wafer that is stuck with an adhesive sheet on a circuit formation surface via an ultraviolet curable adhesive and is mounted to a ring frame on the rear surface side thereof via a dicing sheet; and a light irradiating means having a focus at a location spaced by a predetermined distance, and being provided so as to enable head-swinging motion thereof and being capable of emitting an ultraviolet ray; wherein the supporting means relatively displaceably supports the semiconductor wafer with respect to the light irradiating means so as to prevent an irradiated surface of the irradiated object from deviating from a position of the focus, correspondingly to the head-swinging motion of the light irradiating means.

In the present invention, such an arrangement may be adopted that the supporting means is supported by a moving means, and the moving means can displace the supporting means such that the irradiated surface is orthogonal to the central optical axis of the light irradiating means.

Further, such an arrangement is adopted that the light irradiating means includes a light irradiating unit for condensing light to form a focus, and a support body for supporting the light irradiating unit so as to enable head-swinging motion thereof.

Furthermore, the present invention adopts such an method that a light irradiation method for irradiating light to an irradiated surface by using a light irradiation apparatus, including a supporting means for supporting an irradiated object, and a light irradiating means having a focus at a location spaced by a predetermined distance and being provided so as to enable head-swinging motion thereof, comprises: performing light irradiation while relatively displacing the irradiated object, so as to prevent the irradiated surface from deviating from a position of the focus, correspondingly to the head-swinging motion of the light irradiating means.

In the light irradiating method, such a method is preferably adopted that the head-swinging mot ion of the light irradiating means and the displacement of the irradiated object are performed so as to maintain a state in which the central optical axis of the light irradiating means is directed in a direction orthogonal to the irradiated surface.

Also, the term "head-swinging motion" in the present invention is not limited to two-dimensional motion which is a swing within a plane of two axis-directions orthogonal to each other, but includes three-dimensional motion which is a swing in three axis-directions orthogonal to each other, and moreover also includes selective motion from either two-dimensional or three-dimensional motion.

According to the present invention, even when the light irradiating means performs the head-swinging motion with respect to the irradiated surface, the position of the focus of the light can be maintained within the irradiated surface by synchronously displacing the irradiated object supported by the supporting means, and the amount of irradiation of the light per unit area to the irradiated surface, i.e. integrated light quantity of the light can be kept constant. Therefore, it is possible to provide a light irradiating apparatus which is easy to control in a small space without complicated control such as enabling change of the head-swinging speed and the illuminance of the light irradiating means.

Also, in the case where the semiconductor wafer stuck with the adhesive sheet is used as the irradiated object, there is no disadvantage that an extremely-thinly grinded wafer or a singulated chip is damaged when the adhesive sheet is peeled off.

Further, according to such an arrangement the central optical axis is directed in the direction orthogonal to the irradiated surface, it is possible to effectively irradiate light while avoiding energy loss of the light.

EXPLANATION OF REFERENCE NUMERALS

10: light irradiating apparatus
11: supporting means
12: multi-joint robot (moving means)
13: ultraviolet ray irradiating means (light irradiating means)
30: ultraviolet ray irradiating unit (light irradiating unit)
31: support body
S: adhesive sheet (irradiated object)
W: semiconductor wafer (irradiated object)
SA: adhesive layer surface (irradiated surface)
C: central optical axis
P: focal axis (focus)

DESCRIPTION OF THE PREFERRED EMBODIMENTS

Hereinafter, preferred embodiments of the invention will be described with reference to the drawings.

Figure 1:
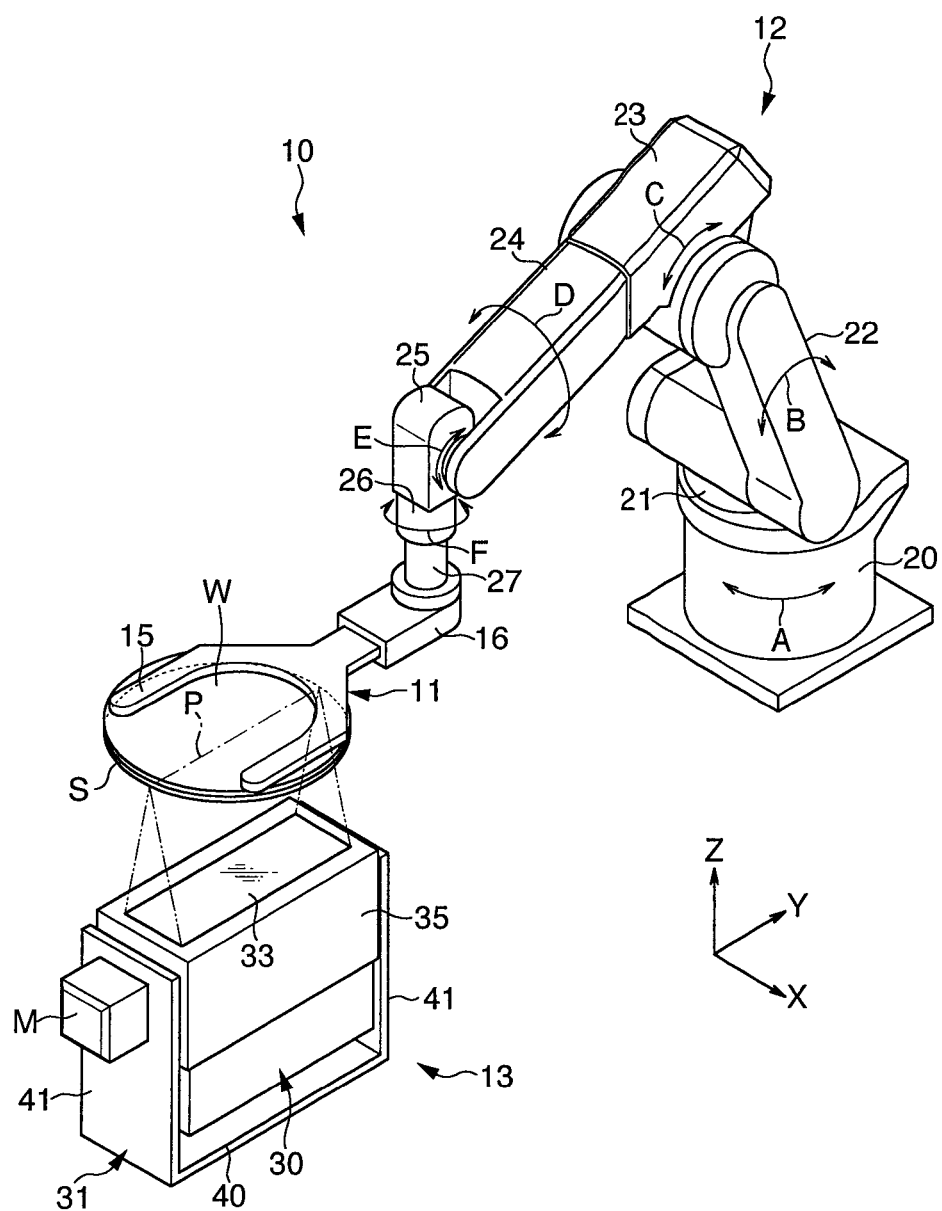
FIG. 1 is a schematic perspective view of an ultraviolet ray irradiating apparatus in accordance with the embodiment.
Figure 2:
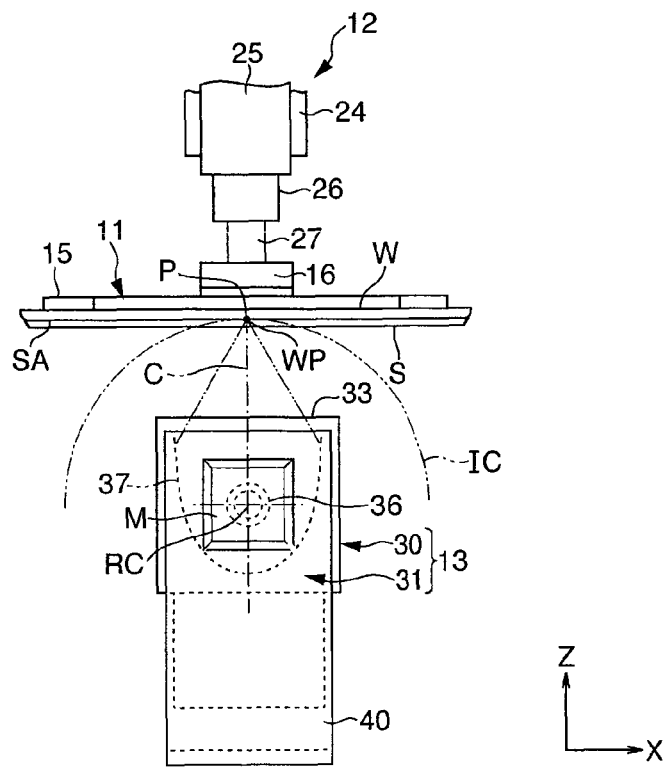
FIG. 2 is a front view thereof with a part of the ultraviolet ray irradiating apparatus being omitted.

FIG. 1 shows a schematic perspective view of a light irradiating apparatus in accordance with the embodiment, and FIG. 2 shows a front view thereof with a part of the apparatus being omitted. In these figures, a light irradiating apparatus 10 comprises: a supporting means 11 for supporting a semiconductor wafer W (an irradiated object) stuck with an adhesive sheet S having an ultraviolet curable adhesive on a lower surface (a circuit formation surface); a multi-joint robot 12, which serves as a moving means, for displaceably supporting the supporting means 11; and an ultraviolet ray irradiating means 13, which serves as a light irradiating means, which is provided at a position relative to the wafer W so as to enable head-swinging motion thereof, the irradiating means 13 being capable irradiating an adhesive layer surface SA of the adhesive sheet S as an irradiated surface with light. Note that strictly speaking, although an adhesive layer has a thickness, the adhesive layer is considered as a plane because such a thickness is very thin, such as several tens of micrometers.

The supporting means 11 comprises a Y-shaped bifurcated suction arm 15, and an arm holder 16 for holding the suction arm 15, wherein a suction region (not shown) is provided on a lower surface side of the suction arm 15. The suction region is connected to a decompression pump (not shown) to be able to suck and hold the wafer W.

The multi-joint robot 12 includes a base 20, first to sixth arms 21 to 26 disposed on an upper surface side of the base 20, and a holding chuck 27 attached to a free-end side of the sixth arm 26. The second, third and fifth arms 22, 23, and 25, are provided rotatably in the B, C, and E directions, respectively, within a Y-Z plane in a state shown in FIG. 1, and the first, fourth and sixth arms 21, 24, and 26 are provided rotatably around each axis thereof, i.e. in the A, D, and F directions, respectively. The multi-joint robot 12 in the embodiment is controlled using numerical control (NC control). That is, the movement amount of each joint with respect to an object (in the embodiment, the wafer W or the like) is controlled based on numerical information corresponding to each, and every movement amount thereof is controlled by using a program. The holding chuck 27 is provided with a pair of chuck pawls (not shown) which can move toward or away from each other, wherein the chuck pawls can engage/disengage the arm holder 16. Note that the holding chuck 27 is configured to exchangeably hold the suction arm 15, and any other transfer arm, cutter blade, and the like.

Figure 3:
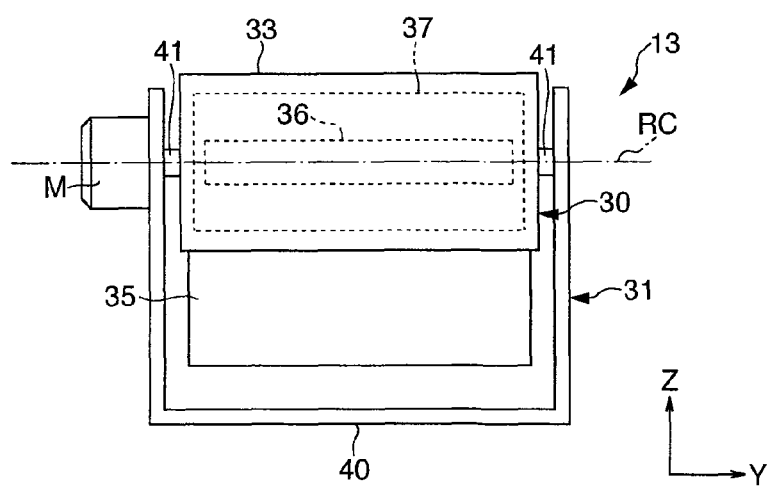
FIG. 3 is a side view of a light irradiating means.

The ultraviolet ray irradiating means 13 includes the ultraviolet ray irradiating unit 30 that forms a focal axis P as a focus along a radial direction of the wafer W (Y-axis direction) (see FIGS. 1 and 2), and a support body 31 for supporting the ultraviolet ray irradiating unit 30 so as to enable head-swinging motion thereof. As shown in FIGS. 1 and 3, the ultraviolet ray irradiating unit 30 comprises: a case 35 having a substantially rectangular parallelepiped shape which includes an irradiation port 33 made of a transparent or translucent member on an upper surface thereof; a lamp 36 constituting a light source, such as a mercury lamp, disposed along the Y-axis direction in the case 35; and a reflective plate 37 provided such that light from the lamp 36 converges to form the focal axis P.

The support body 31 comprises a frame 40 having a generally U-shaped frame which is opened upward, and a motor M, and a shaft 41 connected to an output shaft of the motor M. The ultraviolet ray irradiating unit 30 is pivotally supported so as to enable head-swinging motion (rotational motion) thereof within an X-Z plane around the rotation center axis RC via the shaft 41 between parts of the frame 40. According to such arrangement, the focal axis P can perform head-swinging motion along an imaginary circular arc IC around the rotation center axis RC, as shown in FIG. 2.

An ultraviolet ray irradiation method in the embodiment will be now described with reference to FIG. 4.

Note that, in the case of the embodiment, as shown in FIG. 2, the multi-joint robot 12 displaces (rotates) the wafer W within a Z-X plane relative to a position where the center in a left and right directions of the wafer W and the adhesive layer surface SA of the adhesive sheet S are located on the focal axis P when the ultraviolet ray irradiating unit 30 is directed in a vertical direction, and around the focal axis P as the rotation center axis WP of the wafer W. Moreover, as shown in FIG. 4 (A), a state, in which the ultraviolet ray irradiating unit 30 rotates around the rotation center axis RC, the wafer W rotates around the rotation center axis WP and the focal axis P is positioned at the right end of the wafer w, is stored in a controlling means, previously not shown, as an initial position.

Figure 4A:
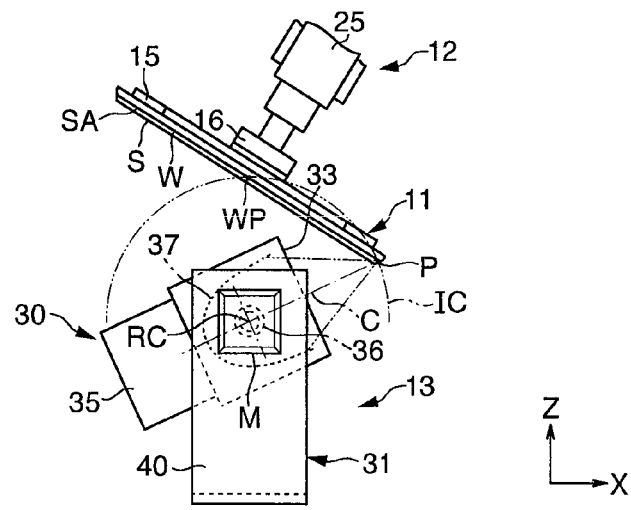
FIGS. 4(A) to 4(C) are action explanatory views for explaining an ultraviolet ray irradiating method.

When the multi-joint robot 12 sucks and holds the wafer W stuck with the adhesive sheet S on the circuit surface thereof through the suction arm 15, the multi-joint robot 12 transports the wafer W to the initial position (see FIG. 4(A)).

Figure 4B:
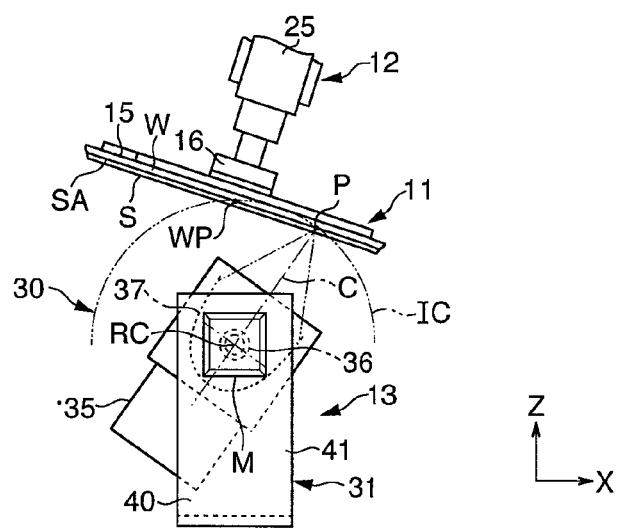

Then, as shown in FIG. 4(B), the ultraviolet ray irradiating unit 30 rotates at a constant velocity within the X-Z plane around the rotation center axis RC while irradiating a preset constant ultraviolet ray using the lamp 36. As a result of such rotation, the focal axis P moves on the imaginary circular arc IC centering around the rotation center axis RC, as shown in FIG. 4. And, the multi-joint robot 12 displaces the wafer W around the rotation center axis WP so as to prevent the adhesive layer surface SA of the adhesive sheet S from deviating from the focal axis P, correspondingly to the rotation of the irradiating unit 30.

Figure 4C:
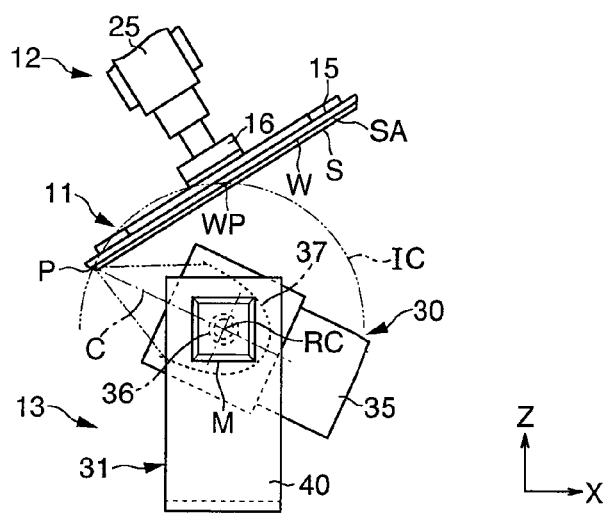

Then, when an ultraviolet ray is irradiated to the left end side of the adhesive sheet S, as shown in FIG. 4(C), the irradiating with the ultraviolet ray is completed. The wafer W is transported to a next process through the multi-joint robot 12, and in another process, the adhesive sheet S is peeled off from the wafer W.

Therefore, according to this embodiment, since such arrangement is employed that the multi-joint robot 12 displaces the wafer W so as to prevent the adhesive layer surface SA of the adhesive sheet S from deviating from the focal axis P correspondingly to the head-swinging motion of the ultraviolet ray irradiating unit 30, such advantage is obtained that the ultraviolet curable adhesive can be uniformly cured in the entire region of the adhesive sheet S while the relative rotation or displacement velocity thereof is kept constant.

As above described, although the best configuration, method, and the like for carrying out the invention have been disclosed in the above description, the present invention is not limited thereto.

Thus, the present invention has been specifically illustrated and described mainly in terms of a specific embodiment, but those skilled in the art may add various modifications to the embodiments described above, as required, in term of shapes, locations, arrangements, or the like without deviating from the scope of a technical idea and an object of the present invention.

For example, such an arrangement may be adopted that an appropriate shutter mechanism is provided outside or on an inner surface side of the irradiation port 33 of the ultraviolet ray irradiating unit 30. According to this, in the case where a lamp, requiring rise time before ultraviolet ray irradiation, is adopted, if the shutter is closed and the lamp is previously turned on, it is possible to start stable ultraviolet ray irradiation concurrently with opening the shutter. Further, as a light source, it is not prevented to adopt a halogen lamp, a fluorescent light, a metal halide lamp, a light-emitting diode, or the like other than a mercury lamp.

Also, in the above embodiment, although the case of the adhesive of the adhesive sheet S being cured by irradiating an ultraviolet ray is described, it is possible to apply to devices and the like which are configured to temporarily stick a heat-sensitive adhesive sheet to a wafer W, and heat it to firmly stick the adhesive sheet to the wafer W. Light in this situation may include an infrared ray and the like, as an example.

Further, it is not necessarily be required for the supporting means 11 to be supported by the multi-joint robot 12, and the arm holder 16 may be configured to be held by an appropriate rotation mechanism. Moreover, the supporting means 11 and the ultraviolet ray irradiating means 13 is not only disposed at a vertically relative position as an illustrated example, but also may be disposed vice versa, or relatively disposed in a horizontal direction. In other words, the present invention may be variously modified as long as requirements described in claims are met.

Furthermore, the irradiated objects are not limited to wafers W, but may also include other things such as glass plates, steel plates, or resin plates, and semiconductor wafers may be silicon wafers or compound wafers.

Figure 5:
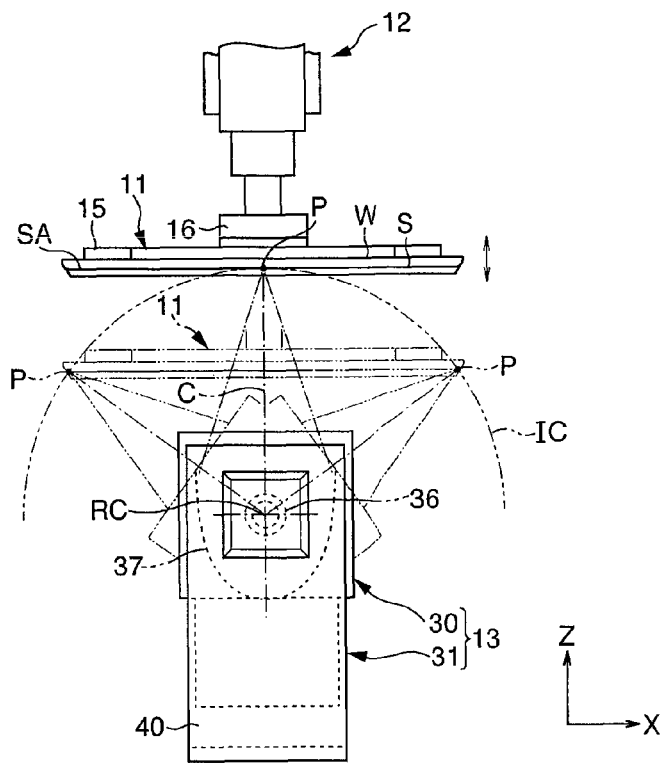
FIG. 5 is an explanatory view of a first variation.

Still further, a way of displacing the wafer W may be a vertical operation, as shown in FIG. 5, other than the rotational operation illustrated in the above embodiment.

Figure 6:
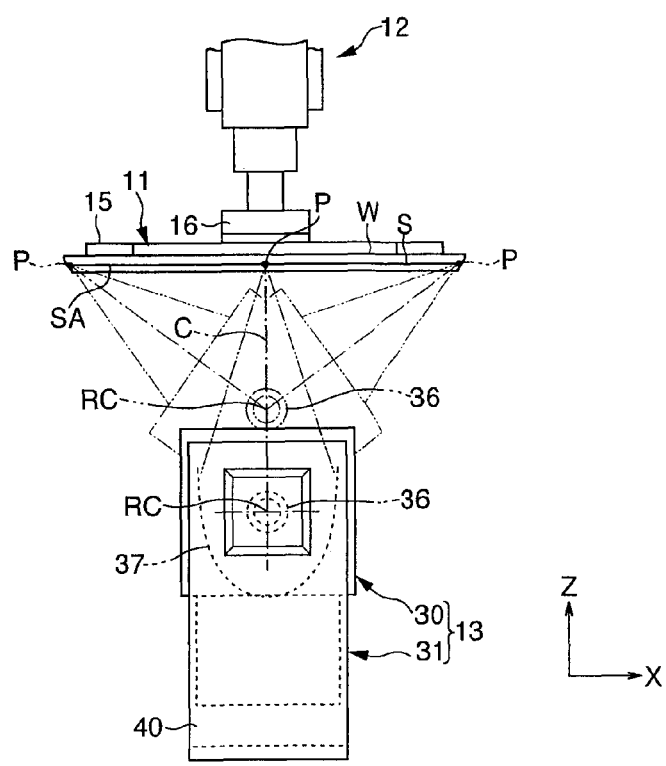
FIG. 6 is an explanatory view of a second variation.

Also, as shown in FIG. 6, such an arrangement may be adopted that the wafer W is fixed at a predetermined position, and the ultraviolet ray irradiating means 13 is displaced so as to prevent the adhesive layer surface SA of the adhesive sheet S from deviating from the focus axis P, correspondingly to the head-swinging motion of the ultraviolet ray irradiating means 13. In this case, a driving means may be provided which enables the ultraviolet ray irradiating means 13 to move vertically.

Figure 7A:
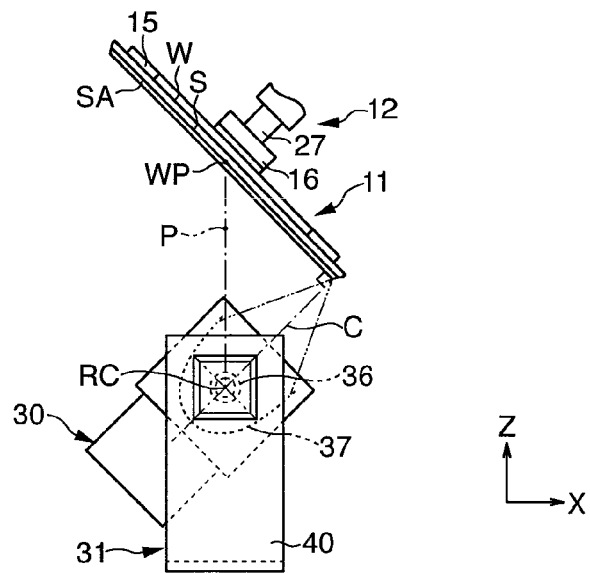
FIGS. 7(A) to 7(C) are an explanatory view of a third variation.
Figure 7B:
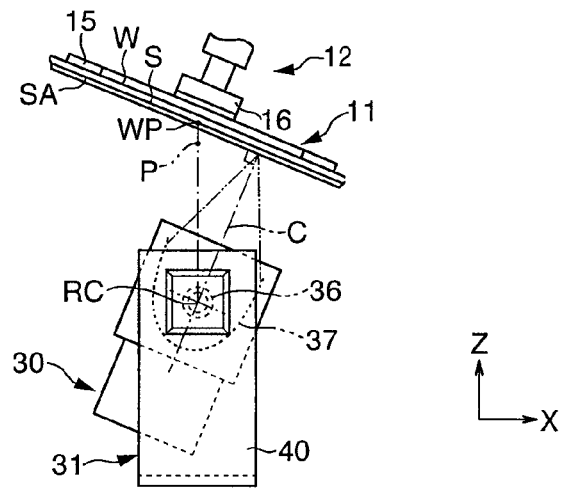
Figure 7C:
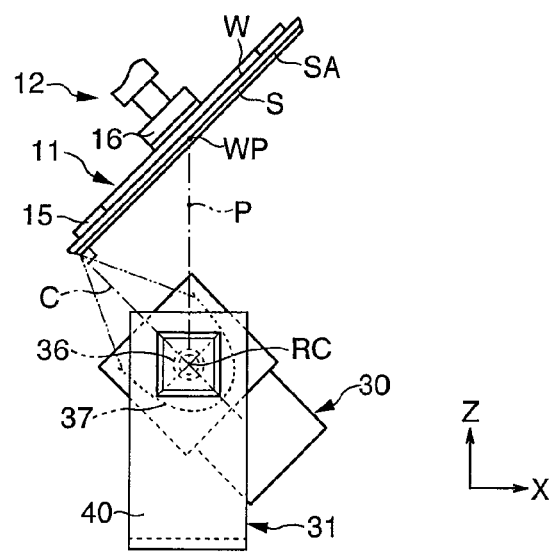

Further, as shown in FIGS. 7(A) to 7(C), such an arrangement may be adopted that the wafer W is displaced through the multi-joint robot 12 such that the irradiated surface is orthogonal to the central optical axis C of the ultraviolet ray irradiating means 13. In this case, the wafer W operates as a complex operation including a rotational operation around the rotation center axis WP and a vertical operation added such that the central optical axis C is entered from a direction orthogonal to the adhesive layer surface SA of the adhesive sheet S, and therefore it is necessary to change a program so that the multi-joint robot 12 can perform such a operation. Such an arrangement can effectively irradiate an ultraviolet ray while reducing energy loss of the ultraviolet ray, and eventually can lower the light quantity of an ultraviolet ray to save electric power consumption.

Figure 8:
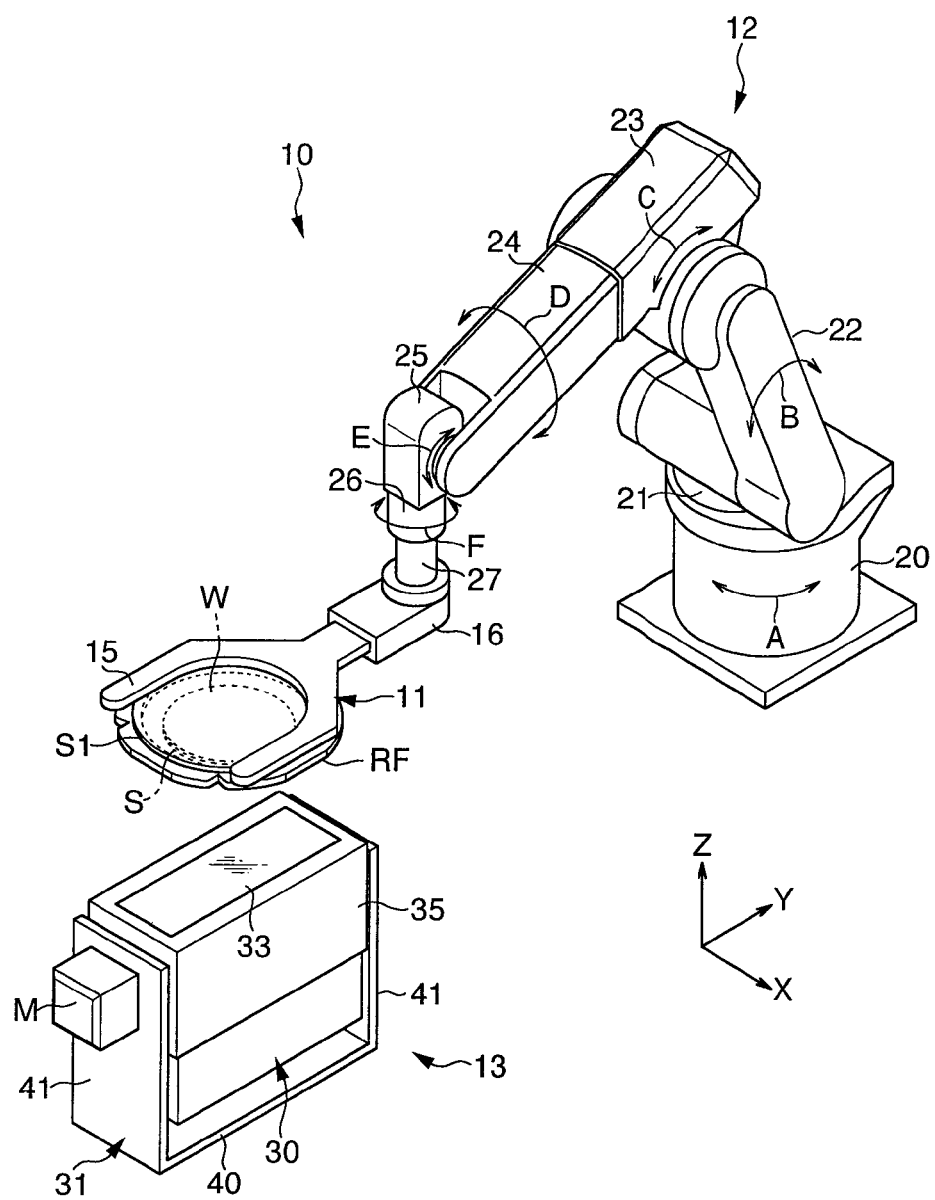
FIG. 8 is a schematic perspective view of a light irradiating apparatus showing a fourth variation.

Furthermore, as shown in FIG. 8, a semiconductor wafer that is stuck with the adhesive sheet S to a lower surface (a circuit formation surface) thereof via an ultraviolet curable adhesive, and on the other hand, that is mounted to a ring frame RF on an upper surface (a rear surface) thereof via a dicing sheet S1 may be used as an irradiated object.

Still further, in the above embodiment, although the focal axis P along a radial direction of the wafer W (a Y-axis direction) has been illustrated and described as a focus, the focus may be a point. In this case, the ultraviolet ray irradiating unit 30 may be configured to enable three-dimensional motion in which it also performs the head-swinging motion within the Y-Z plane in addition to the head-swinging motion within the X-Z plane, and the supporting means 11 may also be configured to enable three-dimensional motion in which it also performs the head-swinging motion within the Y-Z plane in addition to within the X-Z plane.

Moreover, as the above embodiment, in the case where the ultraviolet curable adhesive is cured, oxygen contained in the air inhibits cure of the ultraviolet curable adhesive. For this reason, such an arrangement may be adopted that the wafer W stuck with adhesive sheet S is surrounded by a casing and the like capable of blocking out outside air, and an ultraviolet ray is irradiated after the inside of the casing is filled with an inert gas atmosphere such as a nitrogen gas. Thus, such an atmosphere is preferably changed based on the properties of the irradiated object.

What is claimed is:

1. A light irradiation apparatus, comprising:

a supporting means for supporting an irradiated object; and a light irradiating means having a focus at a location spaced by a predetermined distance and being provided so as to enable head-swinging motion thereof;

wherein the supporting means relatively displaceably supports the irradiated object with respect to the light irradiating means so as to prevent an irradiated surface of the irradiated object from deviating from a position of the focus, correspondingly to the head-swinging motion of the light irradiating means.

2. The light irradiation apparatus according to claim 1, wherein the supporting means is supported by a moving means, and the moving means can displace the supporting means such that the irradiated surface is orthogonal to the central optical axis of the light irradiating means.

3. The light irradiation apparatus according to claim 1, wherein the light irradiating means includes a light irradiating unit for condensing light to form a focus, and a support body for supporting the light irradiating unit so as to enable head-swinging motion thereof.

4. A light irradiation apparatus, comprising: a supporting means for supporting a semiconductor wafer that is stuck with an adhesive sheet on a circuit formation surface via an ultraviolet curable adhesive and is mounted to a ring frame on the rear surface side thereof via a dicing sheet; and a light irradiating means having a focus at a location spaced by a predetermined distance, and being provided so as to enable head-swinging motion thereof and being capable of emitting an ultraviolet ray;

wherein the supporting means relatively displaceably supports the semiconductor wafer with respect to the light irradiating means so as to prevent an irradiated surface of the semiconductor wafer from deviating from a position of the focus, correspondingly to the head-swinging motion of the light irradiating means.

5. A light irradiation method for irradiating light to an irradiated surface by using a light irradiation apparatus including a supporting means for supporting an irradiated object, and a light irradiating means having a focus at a location spaced by a predetermined distance and being provided so as to enable head-swinging motion thereof, the method comprising:

performing light irradiation while relatively displacing the irradiated object, so as to prevent the irradiated surface from deviating from a position of the focus, correspondingly to the head-swinging motion of the light irradiating means.

6. The light irradiation method according to claim 5, wherein the head-swinging motion of the light irradiating means and the displacement of the irradiated object are performed so as to maintain a state in which the central optical axis of the light irradiating means is directed in a direction orthogonal to the irradiated surface.

* * * * *